(12) United States Patent
Oka

(10) Patent No.: US 10,328,511 B2
(45) Date of Patent: Jun. 25, 2019

(54) LASER APPARATUS WITH CAPACITOR DISPOSED IN VICINITY OF LASER DIODE

(71) Applicant: SUMITOMO ELECTRIC DEVICE INNOVATIONS, INC., Yokohama-shi, Kanagawa (JP)

(72) Inventor: Yoshiki Oka, Yokohama (JP)

(73) Assignee: SUMITOMO ELECTRIC DEVICE INNOVATIONS, INC., Yokohama-shi (JP)

(*) Notice: Subject to any disclaimer, the term of this patent is extended or adjusted under 35 U.S.C. 154(b) by 0 days.

(21) Appl. No.: 14/982,503

(22) Filed: Dec. 29, 2015

(65) Prior Publication Data

US 2016/0129513 A1   May 12, 2016
US 2017/0225250 A9   Aug. 10, 2017

Related U.S. Application Data

(63) Continuation-in-part of application No. 13/311,064, filed on Dec. 5, 2011, now abandoned.

(30) Foreign Application Priority Data

Dec. 3, 2010   (JP) ................................ 2010-270799

(51) Int. Cl.
*B23K 1/00* (2006.01)
*B23K 3/06* (2006.01)
(Continued)

(52) U.S. Cl.
CPC .......... *B23K 1/0016* (2013.01); *B23K 3/0623* (2013.01); *B23K 3/087* (2013.01);
(Continued)

(58) Field of Classification Search
CPC .......................... B23K 1/0016; B23K 35/262; B23K 35/3013; B23K 3/0623; B23K 3/087; H01S 5/02256; H01S 5/042
See application file for complete search history.

(56) References Cited

U.S. PATENT DOCUMENTS 3,486,223 A    12/1969  Butera
4,773,075 A *   9/1988  Akiba ...................... G02B 6/42
                                              369/122

(Continued)

FOREIGN PATENT DOCUMENTS

JP    62-119930 A    6/1987
JP     4-87393 A    3/1992
(Continued)

OTHER PUBLICATIONS

HDDGURUFORUMS, http://forum.hddguru.com/viewtopic.php?f=1&t=24397&sid=6e55a3875822a51d92e095a119b815d8, Nov. 3, 2012 (Year: 2012).*

(Continued)

*Primary Examiner* — Erin B Saad
*Assistant Examiner* — Carlos J Gamino
(74) *Attorney, Agent, or Firm* — Westerman, Hattori, Daniels & Adrian, LLP

(57) ABSTRACT

A laser assembly is disclosed. The laser assembly includes a carrier for mounting a semiconductor laser diode (LD) and a capacitor thereon. The carrier provides, in a top surface thereof, a metal pattern having a die area for mounting the LD through a brazing material, a mounting area, and an auxiliary area for absorbing a surplus brazing material. The capacitor is mounted on the mounting area closer to the LD through another brazing material.

7 Claims, 8 Drawing Sheets

(51) Int. Cl.
  *B23K 3/08* (2006.01)
  *B23K 35/26* (2006.01)
  *B23K 35/30* (2006.01)
  *H01S 5/022* (2006.01)
  *H01S 5/042* (2006.01)

(52) U.S. Cl.
  CPC ........ *B23K 35/262* (2013.01); *B23K 35/3013* (2013.01); *H01S 5/02256* (2013.01); *H01S 5/042* (2013.01); *H01L 2224/48091* (2013.01); *H01L 2924/19107* (2013.01)

(56) References Cited

U.S. PATENT DOCUMENTS

| | | | |
|---|---|---|---|
| 5,369,880 A | 12/1994 | Gundotra et al. | |
| 5,770,468 A | 6/1998 | Kosaki | |
| 5,878,942 A | 3/1999 | Kodama et al. | |
| 6,204,490 B1 | 3/2001 | Soga et al. | |
| 6,292,500 B1* | 9/2001 | Kouchi | H01S 5/042 372/38.1 |
| 6,456,641 B1* | 9/2002 | Hauer | H01S 5/022 372/34 |
| 6,531,232 B1 | 3/2003 | Baleras et al. | |
| 6,566,611 B2 | 5/2003 | Kochanowski et al. | |
| 6,774,339 B1 | 8/2004 | Smathers et al. | |
| 6,778,486 B1 | 8/2004 | Arikawa et al. | |
| 7,144,788 B2* | 12/2006 | Kihara | G02B 6/4201 257/E21.44 |
| 7,242,033 B2 | 7/2007 | Isokawa et al. | |
| 7,365,274 B2 | 4/2008 | Miya et al. | |
| 7,367,489 B2 | 5/2008 | Pendse | |
| 7,793,818 B2 | 9/2010 | Tago et al. | |
| 8,123,110 B2 | 2/2012 | Berger et al. | |
| 2002/0121863 A1* | 9/2002 | Morishita | B82Y 20/00 315/169.3 |
| 2003/0015572 A1 | 1/2003 | Faska et al. | |
| 2005/0094687 A1 | 5/2005 | Naganuma | |
| 2007/0230521 A1 | 10/2007 | Ishikawa et al. | |
| 2009/0056985 A1 | 3/2009 | Hirano et al. | |
| 2009/0289101 A1 | 11/2009 | Du et al. | |
| 2011/0067911 A1 | 3/2011 | Ishikawa et al. | |
| 2012/0138665 A1* | 6/2012 | Oka | B23K 1/0016 228/125 |
| 2013/0011104 A1* | 1/2013 | Sato | G02B 6/4244 385/93 |
| 2014/0102626 A1* | 4/2014 | Clayton | H05K 3/363 156/196 |

FOREIGN PATENT DOCUMENTS

| | | |
|---|---|---|
| JP | 2003-110183 A | 4/2003 |
| JP | 2003-282607 A | 10/2003 |
| JP | 2004-289011 A | 10/2004 |
| JP | 2005-228959 A | 8/2005 |
| JP | 2005-236297 A | 9/2005 |
| JP | 2007-273574 A | 10/2007 |
| JP | 2007-273735 A | 10/2007 |
| JP | 2008-91960 A | 4/2008 |
| JP | 2008-205326 A | 9/2008 |
| JP | 2012-119637 A | 6/2012 |
| JP | 2013-074187 A | 4/2013 |
| WO | 2004/077630 A1 | 9/2004 |

OTHER PUBLICATIONS

Office Action dated Jan. 5, 2016, issued in counterpart Japanese Patent Application No. 2015-038695, with English translation. (11 pages).

Japanese Office Action dated May 13, 2014, issued in corresponding Japanese Patent Application No. 2010-270799 with English translation (11 pages).

Office Action dated Apr. 3, 2018, issued in counterpart Japanese Application No. 2014-162643, with English translation (8 pages).

Office Action dated Nov. 13, 2018, issued in counterpart Japanese Application No. 21014-162643, with English translation (6 pages).

* cited by examiner

LASER APPARATUS WITH CAPACITOR DISPOSED IN VICINITY OF LASER DIODE

CROSS-REFERENCE TO RELATED APPLICATIONS

This application is a continuous-in-part of a pending U.S patent application Ser. No. 13/311,064 filed Dec. 5, 2011 by Oka for METHOD FOR FABRICATING OPTICAL SEMI-CONDCUTOR DEVICE, which is hereby incorporated herein by reference in their entirety. This patent application also claims priority to Japanese Patent Application No. 2010-270799, filed Dec. 3, 2010, which is also hereby incorporated by reference in its entirety.

BACKGROUND OF THE INVENTION

1. Field of the Invention

The present application relates to a laser apparatus comprising a semiconductor laser diode (LD) and a bypassing capacitor disposed in a vicinity of the LD.

2. Background Arts

In an optical communication system, an advanced technique to utilize a phase of signal light has become popular to bring further communication capacity. Such an optical communication system is often called as the coherent communication system. FIG. 7 schematically illustrates an arrangement of an optical signal source 100 used in the coherent communication system. The optical signal source 100 shown in FIG. 7 provides an LD 102 biased with a DC power supply 101 and an optical modulator 103. The LD 102 emits continuous-wave (CW) light L11, and the optical modulator 103 modulates the CW light L11 to output a modulated light L12. The optical signal source 100 sometimes installs a wavelength tunable LD as the LD 102 disclosed in, for instance, the U.S. Pat. No. 7,362,782.

The LD 102 implemented in the optical signal source 100 is strongly requested to generate the CW light with line width thereof as narrower as possible. Electrical noises superposed on the bias provided to the LD 102 degrade the line width. The DC power supply 101 inherently causes noises, but the bias line 104 sometimes superposes noises by the electro-magnetic interference (EMI), in particular, noises with high frequencies. A bias line for supplying a DC bias usually accompanies with bypassing capacitors against the ground. However, the bypassing capacitor is necessary to be connected to the LD as close as possible because, when a substantial bias line is left between the LD and the bypassing capacitor, the left bias line causes noises. In particular, when the optical modulator 103 modulates the CW light L11 by modulation signals whose frequency reaches and sometimes exceeds 10 GHz, the left bias line between the LD and the bypassing capacitor is further preferable as short as possible.

SUMMARY OF THE INVENTION

One aspect of the present application relates to a laser assembly that comprises a carrier, a metal pattern provided on the carrier, an LD, and a capacitor. The metal pattern includes a die area, a mounting area, and an auxiliary area. The die area and the auxiliary area are provided with a brazing material. The LD is mounted on the die area through the brazing material. A feature of the laser assembly of the present application is that the capacitor is mounted on the mounting area through another brazing material that is apart from the brazing material.

Another aspect of the present application relates to a method to assemble a laser assembly. The method includes steps of: (1) forming a metal pattern on a carrier, where the metal pattern includes a die area, a mounting area, and an auxiliary area; (2) depositing a brazing material only on the die area and the auxiliary area of the metal pattern; (3) mounting an LD on the die area as absorbing a surplus brazing material in the auxiliary area; (4) applying another brazing material on the mounting area so as not to be in contact with the brazing material; and (5) mounting a capacitor on the mounting area as interposing the another brazing material between the mounting area and the capacitor.

BRIEF DESCRIPTION OF DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the preset application will be described as referring to drawings. In the description of the drawings, numerals or symbols same with or similar to each other will refer to elements same with or similar to each other without duplicating explanations.

Figure 1:
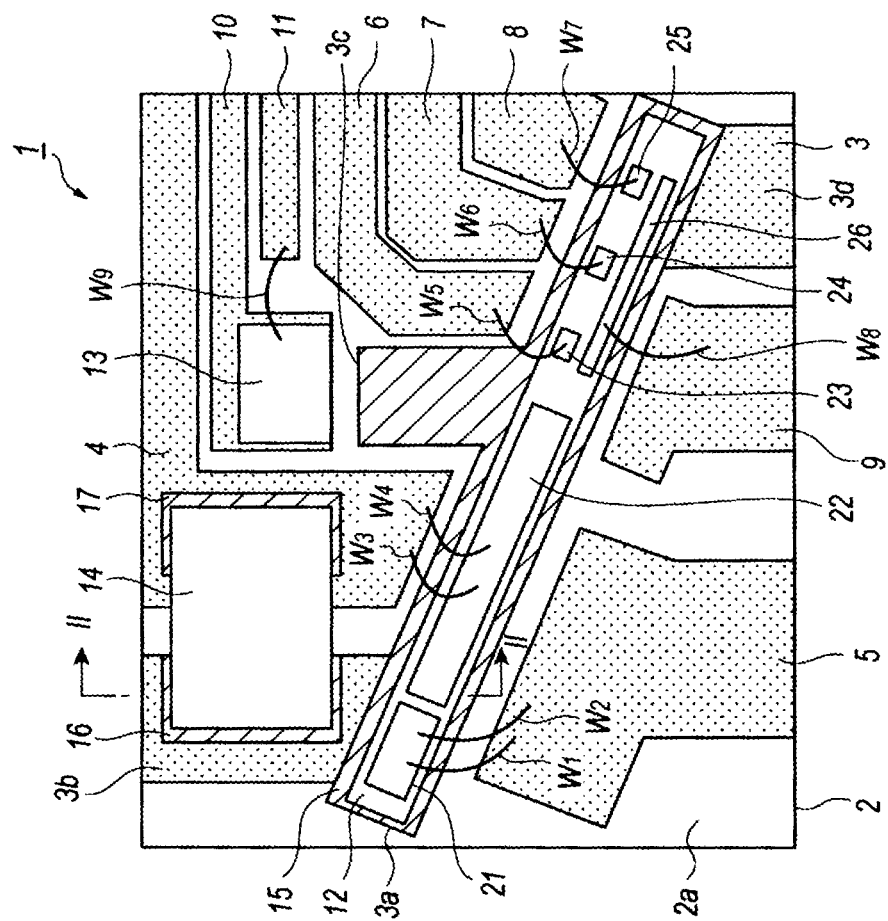
FIG. 1 is a plan view of a laser assembly according to the first embodiment of the present application.
Figure 2:
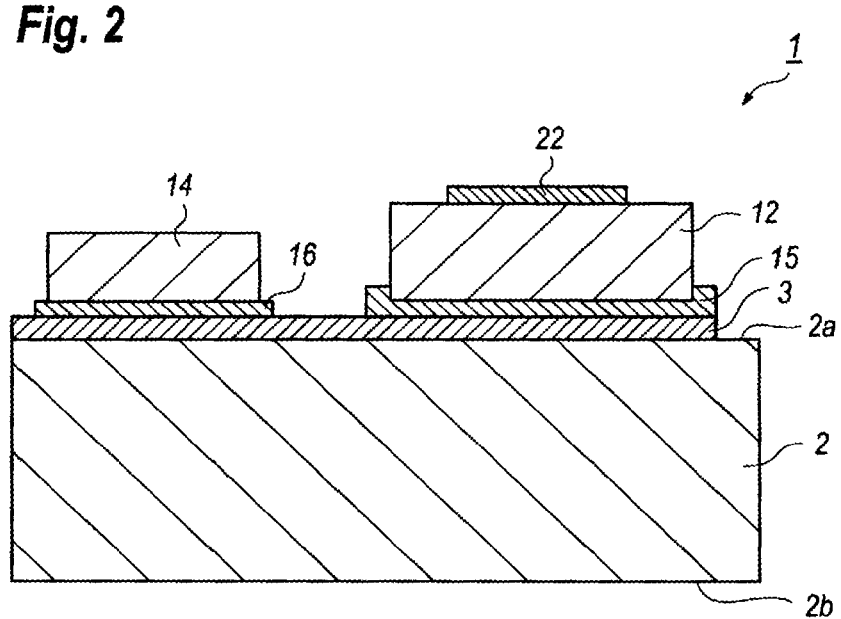
FIG. 2 shows a cross section taken along the ling II-II denoted in FIG. 1.

FIG. 1 is a plan view of a laser assembly according to the first embodiment of the present invention, and FIG. 2 shows a cross section of a laser assembly 1 taken along the ling II-II appearing in FIG. 1. The laser assembly 1 of the present embodiment, as shown in FIGS. 1 and 2, provides a carrier 2 including a plurality of metal patterns, 3 to 11, on a top surface thereof, a semiconductor laser diode (LD) 12, a thermistor 13, a capacitor 14, and a plurality of bonding wires, $W_1$ to $W_9$.

The carrier 2, which may be made of inorganic material such as aluminum oxide (AlOx), aluminum nitride (AlN), and so on, provides the metal patterns, 3 to 11, on a top surface $2a$ thereof. The LD 12, the thermistor 13, and the capacitor 14 are mounted on the metal patterns, and the bonding wires, $W_1$ to $W_9$, connect the metal patterns, 3 to 11, to the LD 12 and the thermistor 13. Although not illustrated in FIG. 2, the carrier 2 may provide a back metal on a back surface 2b opposite to the top surface 2a, where the back metal may be a ground electrode.

The metal patterns, 3 to 11, may be made of stacked metal coated or plated with gold (Au) and/or platinum (Pt) in the top of the metal stack. The present embodiment provides the metal patterns, 3 to 5, with stacked metals of titanium (Ti), platinum (Pt), and gold (Au). Respective metal patterns, 3 to 11, supply electronic power for heaters, which will be described later, bias voltages, and bias currents to the LD 12. Specifically, the metal pattern 3 provides the ground, while, the metal pattern 4 supplies the bias current. The metal pattern 3, namely the ground pattern, comprises die area 3a, a mounting area 3b, an auxiliary area 3c, and a pad 3d. The die area 3a mounts the LD 12 thereon. The mounting area 3b, which extends from the die area 3a substantially in parallel to the auxiliary area 3c, mounts the capacitor 14. The pad 3d is connected to the outside of the laser assembly to provide the ground potential. The metal pattern 4 comprises another mounting area 4a.

The LD 12 of the present embodiment has a type of, what is called, a wavelength tunable LD having an optical axis extending in parallel to an optical waveguide implemented within the LD 12. The LD 12 may output light, whose wavelength may be tuned by supplying the bias voltage and/or the bias current through the metal patterns, 3 to 11, from the facet perpendicular to the optical axis. The LD 12 is mounted on the die area 3a through a brazing material 15. FIG. 1 denotes the brazing material 15 by hatched area that covers the whole die area 3a and the auxiliary area 3c. The brazing material 15 may be a solder made of eutectic metal or electrically conductive resin. The LD 12 may provide a back metal to be grounded through the brazing material on the metal pattern 3.

The LD 12 may include a semiconductor optical amplifier (SOA) region, a gain region, and a tuning region along the optical axis thereof. The SOA, which amplifies light generated by the gain region, includes an electrode 21 to supply a bias current into the SOA. The electrode 21 is connected to the metal pattern 5 by bonding wires, $W_1$ and $W_2$. The gain region, which generates light to be amplified in the SOA, provides an electrode 22 to supply a bias current into the gain region. The electrode 22 is connected to the metal pattern 4 through bonding wires, $W_3$ and $W_4$. The tuning region, which may tune the wavelength of the light generated in the gain region, provides electrodes, 23 to 26, each connected to the metal patterns, 6 to 9, by respective bonding wires, $W_5$ to $W_8$. The electrode 26 extending along the optical axis within the whole tuning region is common to other electrodes, 23 to 25. Although not shown in FIG. 1, several heaters are provided between the electrodes, 23 to 25, and the common electrode 26. The metal patterns, 6 to 8, supply the power to respective heaters to tune the wavelength of the light generated in the gain region. Thus, the wavelength of the light output from the LD 12 through the facet may be tuned.

The thermistor 13 may sense a temperature of the top surface 2a of the carrier 2. The power supplied to respective heaters in the tuning region may be controlled depending on the temperature of the top surface 2a sensed by the thermistor 13. The thermistor 13 in one electrode thereof faces and comes in contact with the metal pattern 10, and in another electrode thereof is connected to another metal pattern 11 through the bonding wire $W_9$.

The capacitor 14 is a type of a bypassing capacitor connected in parallel to the LD 12 between the metal patterns, 3 and 4. The capacitor 14 provides two electrodes, one of which is mounted on the mounting area 3b of the metal pattern 3, while, the other is mounted on the metal pattern 4 each through respective brazing materials, 16 and 17. The brazing materials, 16 and 17, for mounting the capacitor 14 preferably has a melting temperature lower than a melting temperature of the other brazing material 15 for mounting the LD 12 onto the die area 3a. In the present embodiment, the former brazing material 16 on the mounting area 3b is apart from the latter brazing material 15 on the die area 3a even after the mount of the capacitor 14, that is, the metal pattern 3 is exposed in the top surface thereof between the brazing materials, 15 and 16.

Figure 8:
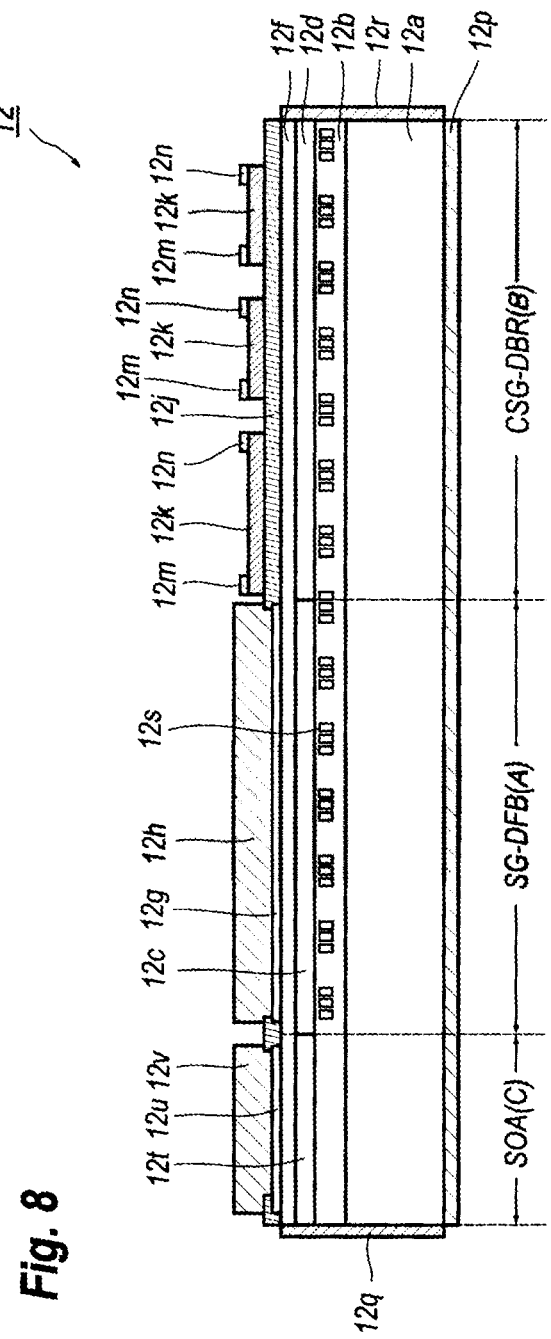
FIG. 8 schematically shows a cross section an LD to be assembled in a laser assembly shown in FIG. 1.

FIG. 8 is a schematic cross-sectional diagram of the whole configuration of an LD 12 to be mounted on an optical semiconductor device according to a first embodiment. As illustrated in FIG. 8, the LD 12 includes an SOA (Semiconductor Optical Amplifier) region C; an SG-DFB (Sampled Grating Distribution Feedback) region A; and a CSG-DBR (Chirped Sample Grating Distributed Reflector) region B, where they are optically coupled in this order. The SG-DFB region A and the CSG-DBR region B operate as a wavelength selection portion to tune an emission wavelength, and the SOA region C has a function to amplify laser light generated in the SG-DFB region A.

The SG-DFB region A includes a lower cladding layer 12b, an active layer 12c, an upper cladding layer 12f, a contact layer 12g and an electrode 12h, where they are stacked on a substrate 12a. The CSG-DBR region B includes the lower cladding layer 12b, an optical waveguide layer 12d, the upper cladding layer 12f, an insulating layer 12j and heaters 12k, where they are also stacked on the substrate 12a. Each of the heaters 12k provides a power supply electrode 12m and a ground electrode 12n. The SOA region C includes the lower cladding layer 12b, an optical amplification layer 12t, the upper cladding layer 12f, a contact layer 12u and an electrode 12v, where they are also stacked on the substrate 12a.

The substrate 12a, the lower cladding layer 12b and the upper cladding layer 12f are common in the SG-DFB region A, the CSG-DBR region B and the SOA region C, that is, the lower cladding layer 12b and the upper cladding layer 12f are concurrently formed at the same time. The active layer 12c, the optical waveguide layer 12d, and the optical amplification layer 12t are formed on the same plane of the top surface of the lower cladding layer 12b. An AR (Anti Reflection) layer 12q is formed on a facet of the substrate 12a, the lower cladding layer 12b, the active layer 12c and the upper cladding layer 12f on the side of the SOA region C. The AR layer 12q acts as a front facet of the LD 12. A reflection layer 12r is formed on a facet of the substrate 12a, the lower cladding layer 12b, the optical waveguide layer 12d, and the upper cladding layer 12f on the side of the CSG-DBR region B. The reflection layer 12r acts as a rear facet R of the LD 12.

A plurality of diffraction gratings (corrugations) 12s are formed in the lower cladding layer 12b of the SG-DFB region A and the CSG-DBR region B with a preset interval. The SG-DFB region A and the CSG-DBR region B have a plurality of segments. One segment comprises of a portion having the diffraction grating 12s and another portion next to the former portion without the diffraction grating 12s. The diffraction grating 12s is made of a material having a refractive index different from that of the lower cladding layer 12b.

In the CSG-DBR region B, at least two of the segments have lengths different from others. Thus, magnitudes of each of reflection peaks attributed to the CSG-DBR region B depends on a wavelength. On the other hand, each optical length of the segments in the SG-DFB region A is substantially equal to each other. Therefore, magnitudes of each of gain peaks attributed to the SG-DFB region A shows independent on a wavelength. Using a Vernier effect between the SG-DFB region A and the CSG-DBR region B, that is, coinciding one of the reflection peaks attributed to the CSG-DBR region B with one of the gain peaks attributed to the SG-DFB region A, an emission wavelength of the LD 12 may be tuned. Thus, the LD 12 may stably oscillate at the thus tuned wavelength.

The substrate 12$a$ may be made of, for example, n-type InP. The lower cladding layer 12$b$ has the n-type conductivity. The upper cladding layer 12$f$ has the p-type conductivity. The lower cladding layer 12$b$ and the upper cladding layer 12$f$ may be, for example, made of InP. The lower cladding layer 12$b$ and the upper cladding layer 12$f$ confines light within the active layer 12$c$, the optical waveguide layer 12$d$ and the optical amplification layer 12$t$.

The active layer 12$c$ is made of semiconductor material showing an optical gain by the carrier injection. The active layer 12$c$ may have the quantum well structure, in particular, a multi quantum well structure (MQW), in which a plurality of well layers each made of $Ga_{0.32}In_{0.68}As_{0.92}P_{0.08}$ having a thickness of 5 nm and a plurality of barrier layers each made of $Ga_{0.22}In_{0.78}As_{0.47}P_{0.53}$ having a thickness of 10 nm are alternately stacked.

The optical waveguide layer 12$d$ may be, for example, made of bulk semiconductor material of $Ga_{0.22}In_{0.78}As_{0.47}P_{0.53}$.

The contact layer 12$g$ may be, for example, made of p-type $Ga_{0.47}In_{0.53}As$. The insulating layer 12$j$ is a protection layer and may be made of an insulator such as SiN or $SiO_2$. The heater 12$k$ is a type of the thin film resistor made of NiCr. Each heater 12$k$ may extend over the several segments in the CSG-DBR region B.

The electrodes 12$h$, the power supply electrode 12$m$ and the ground electrode 12$n$ are made of conductive material such as Au (gold). A back electrode 12$p$, namely, the back metal, is formed on a back surface of the substrate 12$a$. The back electrode 12$p$ may be, for example, made of Au (gold). The back electrode 12$p$ extends over the SG-DFB region A, the CSG-DBR region B and the SOA region C, that is, the back electrode 12$p$ is provided in a whole back surface of the LD 12.

The optical amplification layer 12$t$ shows an optical gain is by the current injection from the electrode 12$v$. The optical amplification layer 12$t$ may also have the MQW structure including alternately stacked well layers made of $Ga_{0.35}In_{0.65}As_{0.99}P_{0.01}$ with a thickness of 5 nm and barrier layers made of $Ga_{0.15}In_{0.85}As_{0.32}P_{0.68}$ with a thickness of 10 nm. The optical amplification layer 12$t$ may be a bulk semiconductor material of $Ga_{0.44}In_{0.56}As_{0.95}P_{0.05}$ The contact layer 12$u$ may be, for example, made of p-type $Ga_{0.47}In_{0.53}As$.

Next, an operation of the LD 12 will be described. Under a stable condition, that is, a predetermined driving current is provided to the electrode 12$h$, each heater 12$k$ generates heat at a predetermined temperature, and the temperature of the LD 12 is set in a predetermined temperature; the SG-DFB region A and the CSG-DBR region B tune one wavelength, and the LD 12 oscillates at the tuned wavelength. The laser light is optically amplified and output from a front facet F (on the side of the SOA region C).

Next, a process to assemble the laser assembly 1 will be described as referring to FIGS. 3A to 4B of the plan views of the carrier 2.

Figure 3A:
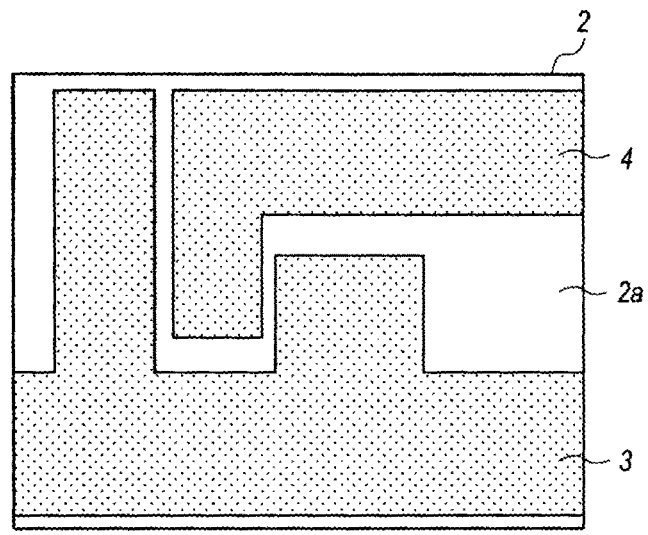
FIG. 3A is a plan view showing a process to assemble the laser assembly according to an embodiment of the present application.
Figure 3B:
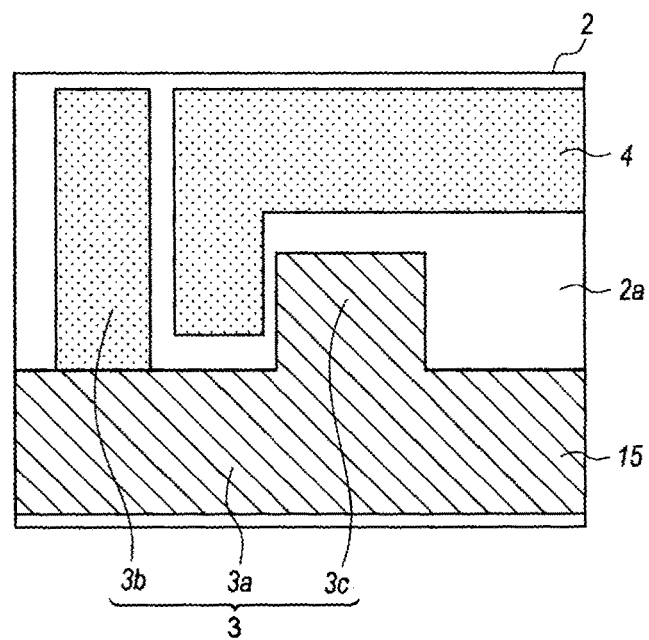
FIG. 3B is a plan view showing a process subsequent to the process of FIG. 3A.

First, the process forms the metal patterns, 3 and 4, on the top surface 2$a$ of the carrier 2 as shown in FIG. 3A which schematically shows the metal patterns. The process may form the metal patterns, 3 and 4, by patterning a metal or stacked metals deposited on the top surface 2$a$ by, for instance, the metal evaporation, or may form metal patterns, 3 and 4, by the selective deposition of a metal or stacked metals. Next, the process may selectively evaporate tin (Sn) and gold (Au) on the die area 3$a$ and the auxiliary area 3$c$ as the brazing material 15 (FIG. 3B). The AuSn film deposited on the metal pattern may have the composition of gold (Au) to be about 70% and a thickness thereof around 5 μm, preferably 4 to 6 μm.

Figure 4A:
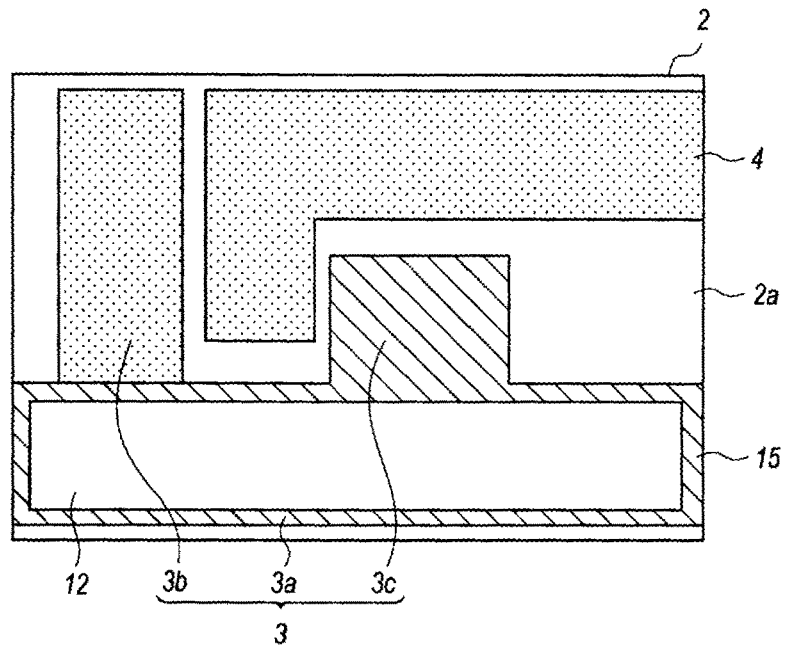
FIG. 4A is a plan view showing a process to assembly the laser assembly subsequent to the process shown in FIG. 3B.

Then, the LD 12 is mounted on the die area 3$a$ (FIG. 4A). Specifically, heating the carrier 2 over 280° C., preferably up to 280 to 300° C., the assembling process may place the LD 12 on thus heated brazing material 15. The brazing material 15 may operate not only as an adhesive to fix the LD 12 but to secure an electrically conductive path from the LD 12 to the ground pattern 3. The auxiliary area 3$c$ attributed to the die area 3$a$ may effectively absorb surplus solder 15 oozing out from a gap between the metal pattern 3 and the LD 12 such that oozed brazing material does not invade into the mounting area 3$b$ due to the surface tension of the brazing material. The mounting area 3$b$ shows lesser wettability for the melted brazing material 15 compared with the auxiliary area 3$c$. Accordingly, the surplus brazing material 15 oozed out from the gap stays within the area where the brazing material 15 exists.

Figure 4B:
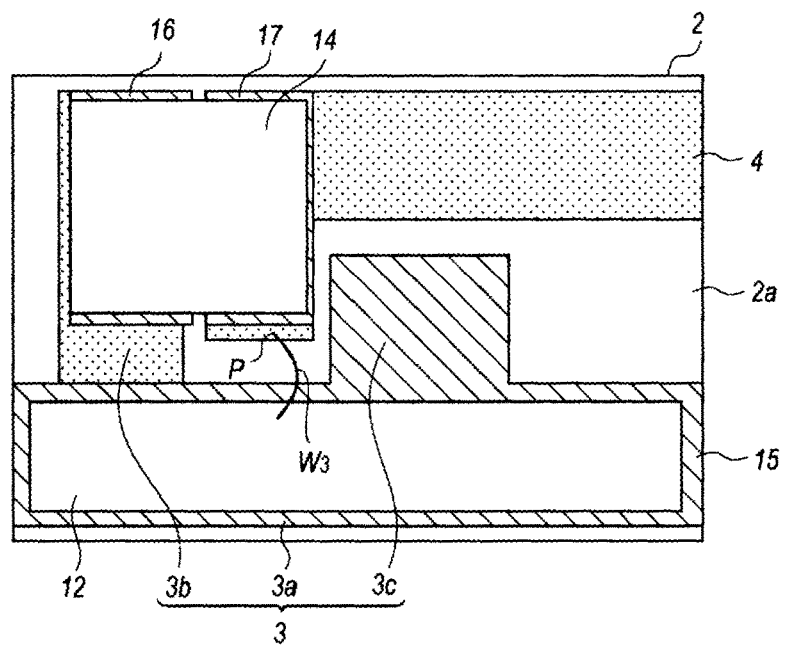
FIG. 4B is a plan view of a process subsequent to the process shown in FIG. 4A.

Then, the process assembles the capacitor 14 on the metal pattern 3 (FIG. 4B). Specifically, melting and spreading other brazing materials, 16 and 17, on respective metal patterns 3 and 4; the capacitor 14 is mounted on thus spread brazing materials, 16 and 17. During the melt and the spread of the brazing materials 16, the brazing material 16 is effectively prevented from merging together with the brazing material 15 spread in advance for mounting LD 12. In an example, solder made of tin-antimony (SnSb) is selected and melted at a temperature over 240° C., preferably 260° C., on the metal patterns 3 and 4. Because of the lowered temperature for mounting the capacitor 14, the former brazing material 15 for mounting the LD 20 is not melted at all. In the process thus described, two brazing materials, 15 and 16, are spread independently in respective steps, that is, the brazing material 15 is first spread in the die area 3$a$ then the other brazing material 16 is spread in the mounting area. After mounting the capacitor 14, the bonding wire $W_3$ is extended from the LD 12 to the metal pattern 4, which configures a parallel circuit of the LD 12 and the capacitor 14 between the metal patterns, 3 and 4.

Figure 5:
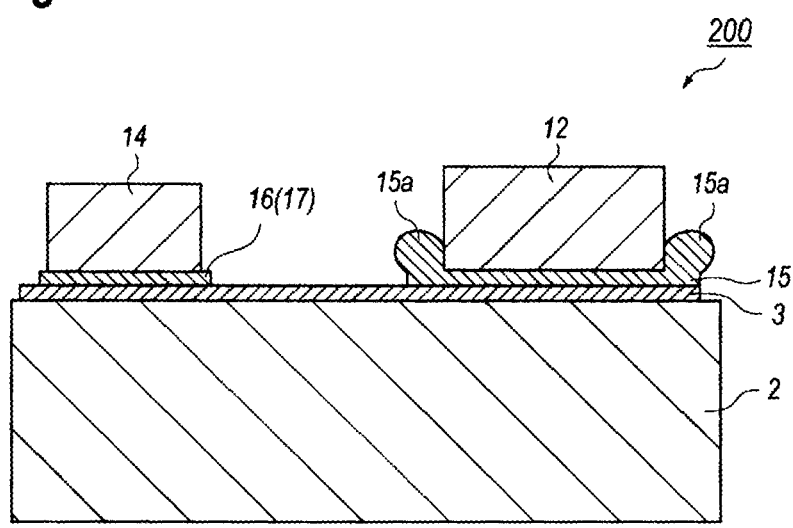
FIG. 5 shows a cross section of a conventional laser assembly.

Next, advantageous reflecting within the laser assembly 1 will be described as comparing with a conventional arrangement. FIG. 5 shows a cross section of a laser assembly 200 having a conventional arrangement with respect to the LD 12 and the capacitor 14. In the conventional arrangement, although not explicitly illustrated in FIG. 5, the metal pattern 3, especially the die area 3$a$ does not accompany with the auxiliary area 3$c$, which means that, when the LD 12 is set on the brazing material 15, surplus portion 15$a$ thereof oozes in all directions as shown in FIG. 5. In particular, the LD 12 of the present embodiment arranges the SOA region, the gain region, and the tuning region along the optical axis thereof, which means that the LD 12 has an enough slender plane shape. When such a slender chip is die bonded on the carrier 2, an enough brazing material 15, namely, eutectic solder, is required for bonding the chip securely. As a result, relatively greater surplus solder oozes out in all directions.

In the conventional laser assembly, the metal patterns surrounding the die area 3a are necessary to set a substantial space, sometimes wider than 100 µm, to the die area 3a for preventing the oozed solder from coming in contact to the metal patterns, which inevitably expands the size of the carrier 2. Also, such oozed surplus solder forces a space between the LD 12 and the capacitor 14, which is unfavorable from the viewpoint of the high speed operation of the LD 12.

On the other hand, the LD assembly 1 of the present embodiment provides the auxiliary area 3c next to the die area 3a in the metal pattern 3. The auxiliary area 3c, where the brazing material 15 is spread in advance to the mount of the LD 12, may effectively absorb the surplus solder, namely, the brazing material 15 oozed out from the gap between the LD 12 and the metal pattern 3 so as to prevent the surplus solder 15 from spreading into the mounting area 3b and coming in contact with the metal patterns surrounding the die area 3a. Accordingly, the metal patterns surrounding the die area 3a may be put closer to the die area 3a.

Moreover, the assembling process of the LD assembly uses another brazing material, 16 and 17, namely, another eutectic alloy for mounting the capacitor 14 on the mounting area 3b. The other brazing material, 16 and 17, has the melting point lower than the melting point of the former brazing material 15 to mount the LD 12. Thus, the brazing material 16 may be spread close enough to the brazing material 15 spread in advance, and the brazing material 15, or the mounted LD 12, is not influenced by the process to mount the capacitor 14. Accordingly, the capacitor 14 is able to be mounted close enough to the LD 12, specifically, within 5 to 10 µm from the LD 12, which shows an advantage for the high speed operation of the LD 12.

Figure 6:
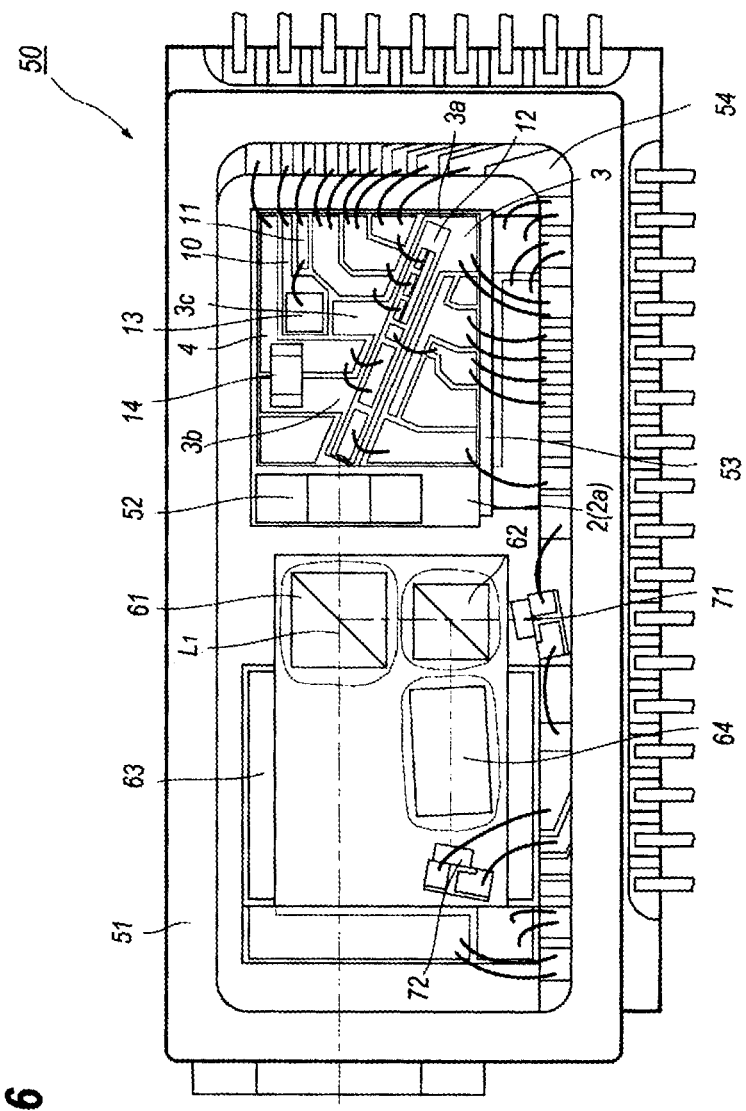
FIG. 6 is a plan view of a laser module that implements a laser assembly shown in FIG. 1.
Figure 7:
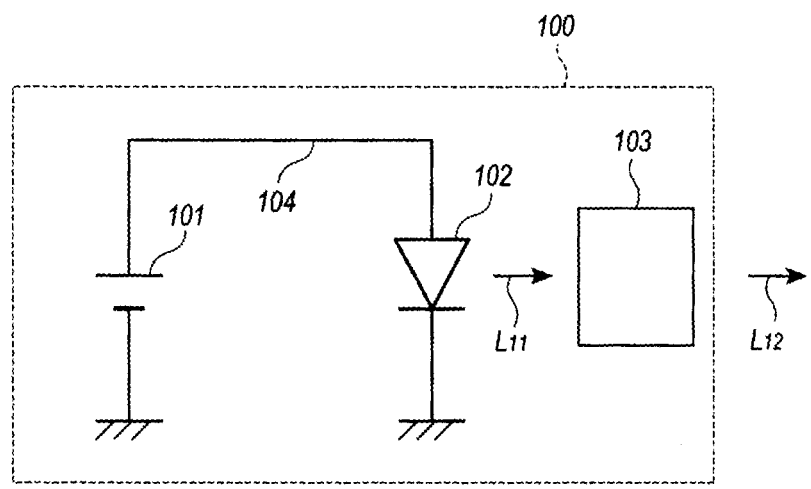
FIG. 7 schematically illustrates a circuit diagram of an optical transmitter for a coherent communication system.

Next, some examples using the laser assembly 1, in particular, a laser module installing the laser assembly 1 will be described. FIG. 6 is a plan view of a laser module 50 installing the laser assembly 1. The laser module 50 includes, in addition to the laser assembly 1, a wavelength locker including first and second beam splitters (BS), 61 and 62, a wavelength filter 64, and first and second photodiodes (PD), 71 and 72.

The laser assembly 1 is mounted on a thermo-electric cooler (TEC) 53 through the carrier 2 accompanied with a collimating lens 52 and electrically communicate with the outside through a feedthrough 54 that includes a plurality of terminals wire-bonded with the metal patterns, 3 to 10, on the carrier 2. Also, the wavelength locker is mounted on another TEC 63 through a carrier. The laser assembly 1 with the TEC 53 and the wavelength locker with another TEC are installed within a housing 51.

The light output from the LD 12 is first collimated by the collimating lens 52, then, enters the first BS 61. The first BS 62 splits the light, one of split light goes to the output port, while, the other of the split light, which is bent by about 90° by the first BS 61 goes to the second BS. The split ratio of the first BS is set to be around 95:5, namely, about 95% of the collimated light goes to the output port and only 5% goes ahead to the send BS 62.

The second BS 62 further splits the light by about 50:50. One of the split light goes to the first PD, while, the rest goes to the wavelength filter 64 which inherently has specific transmittance. The second PD 72 detects the light output from the wavelength filter 64. On the other hand, the first PD 71 may detect raw beam output from the LD 12, which means that the light output from the LD 12 but not affected from any specific optical characteristic. Thus, calculating the ratio of the output from the second PD 72 against the output from the first PD 71, the practical transmittance of the wavelength filter 64 may be determined. Comparing thus obtained transmittance with the practical transmittance of the wavelength filter, the wavelength of the light currently output from the LD 12 may be precisely determined.

When the current wavelength of the LD 12 thus determined is different from a target wavelength of the LD 12, the biases supplied to the LD 12 and the power also supplied to the heaters of the LD 12 may be adjusted such that the current wavelength becomes coincident with, or closer to, the target wavelength.

The wavelength filter 64 may be, what is called, an etalon filter that inherently shows a periodic transmittance. Setting the target wavelength to be a point, at which the periodic transmittance of the etalon filter in a slope thereof becomes large, the current wavelength of the LD 12 may be precisely matched with the target wavelength because of the increased gain of the feedback loop described above.

Even in the laser module 50, the capacitor 14 may be mounted enough closer to the LD 12 in the mounting area 3b but apart from the die area, which enables the side of the carrier 2 small enough. The smaller carrier 2 results in small heat capacity on the TEC 53. Accordingly, the convergence of the current wavelength on the target wavelength may be accelerated.

While particular embodiments of the present invention have been described herein for purposes of illustration, many modifications and changes will become apparent to those skilled in the art. For instance, the auxiliary area 3c for absorbing the surplus brazing material 15 is not always to be brought out from the die area 3a along a direction same with that of the mounting area 3b. When the auxiliary area 3c extends perpendicular to the die area 3a toward one direction and the mounting area 3b also extends perpendicular to the die area 3a but toward another direction opposite to the former one, that is, the auxiliary area 3c faces the mounting area 3b as putting the die area 3a therebetween, the capacitor 14 may be mounted further closer to the LD 12.

The embodiment uses the capacitor 14 having the type of, what is called, a chip capacitor with two electrodes thereof laterally disposed. However, the laser assembly 1 may use a capacitor with the type of a die capacitor with two electrodes thereof vertically disposed. For such an arrangement, the die capacitor 14 is mounted on the mounting area 3b as the bottom electrode thereof faces and comes in contact to the mounting area 3b, while, the top electrode thereof is connected to the metal pattern 4 with a bonding wire. Accordingly, the appended claims are intended to encompass all such modifications and changes as fall within the true spirit and scope of this invention.

What is claimed is:

1. A method of assembling a laser assembly that comprises a semiconductor laser diode (LD) and a carrier, the LD having a front facet that emits laser light and a rear facet in respective ends along a longitudinal direction thereof, the carrier having a rectangular plane shape demarcated by four sides and mounting the LD thereon, the method comprising steps of:

forming a metal pattern including a die area, a mounting area, another mounting area, and an auxiliary area on a carrier such that the die area in a longitudinal direction thereof obliquely extends with respect to the sides of the carrier, the mounting area extends from the die area, the another mounting area is isolated from the mounting area, and the auxiliary area that has a trapezoid plane shape having three sides each extending in parallel with the sides of the carrier protrudes from the die area making an obtuse angle against the die area in a side closer to the mounting area;

depositing a solder on the die area and the auxiliary area of the metal pattern;

placing the LD on the die area such that the front facet thereof is closer to the mounting area than the auxiliary area and the longitudinal direction of the LD extends in parallel to the longitudinal direction of the die area so as to be configured to absorb a surplus solder in the auxiliary area;

applying another solder on the mounting area and the another mounting area so as not to be in contact with the solder; and mounting a capacitor between the mounting area and the another mounting.

2. The method of claim 1, wherein the step of mounting the capacitor is performed at a temperature lower than a temperature at which the step of placing the LD is performed.

3. The method of claim 2, wherein the solder is gold-tin (AuSn), and wherein the step of placing the LD includes steps of heating the carrier over 280° C. and placing the LD on the solder.

4. The method of claim 3, wherein the another solder is tin-antimony (SnSb), and wherein the step of mounting the capacitor includes steps of heating the carrier over 240° C. but below 280° C. and placing the capacitor on the another solder in the mounting area and the another mounting area.

5. The method of claim 1, wherein the solder is gold-tin (AuSn), and wherein the step of depositing the solder evaporates the solder by a thickness of 4 to 6 µm.

6. The method of claim 1, wherein the step of applying the another solder includes steps of:

heating the carrier up to a temperature lower than a temperature at which the step of placing the LD on the die area is carried out, placing the another solder on the mounting area and the another mounting area, and spreading the another solder within the mounting area not so as to be in contact with the solder.

7. The method of claim 1, wherein the step of forming the metal pattern arranges the auxiliary area on a center portion of the carrier.

* * * * *

UNITED STATES PATENT AND TRADEMARK OFFICE
CERTIFICATE OF CORRECTION

PATENT NO. : 10,328,511 B2
APPLICATION NO. : 14/982503
DATED : June 25, 2019
INVENTOR(S) : Yoshiki Oka It is certified that error appears in the above-identified patent and that said Letters Patent is hereby corrected as shown below:

On the Title Page

Item (72), change:
(72) Inventor: Yoshiki Oka, Yokohama (JP)

To read:
(72) Inventor: Yoshiki Oka, Yokohama (JP)
        Keiji Nakazawa, Yokohama (JP)
        Mitsuyoshi Miyata, Yokohama (JP)
        Hiromitsu Kawamura, Yokohama (JP)

Signed and Sealed this
Twenty-eighth Day of July, 2020

Andrei Iancu
*Director of the United States Patent and Trademark Office*